(12) United States Patent
Chen (10) Patent No.: US 12,512,830 B2
(45) Date of Patent: Dec. 30, 2025

(54) INPUT CIRCUIT HAVING ADAPTIVE VOLTAGE-RECEIVING MECHANISM

(71) Applicant: REALTEK SEMICONDUCTOR CORPORATION, Hsinchu (TW)

(72) Inventor: Jyun-Ren Chen, Hsinchu (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 55 days.

(21) Appl. No.: 18/537,030

(22) Filed: Dec. 12, 2023

(65) Prior Publication Data

US 2024/0231405 A1    Jul. 11, 2024

(30) Foreign Application Priority Data

Jan. 5, 2023    (TW) ................. 112100442

(51) Int. Cl.
*H03K 17/10*    (2006.01)
*H03K 17/081*    (2006.01)
*H03K 19/003*    (2006.01)

(52) U.S. Cl.
CPC ..... *H03K 17/102* (2013.01); *H03K 17/08104* (2013.01); *H03K 19/00315* (2013.01)

(58) Field of Classification Search
None
See application file for complete search history.

(56) References Cited

U.S. PATENT DOCUMENTS 5,748,033 A * 5/1998 Kaveh .................. G05F 1/59
                                                        327/321
6,856,168 B2 * 2/2005 Oertle .............. H03K 19/00315
                                                         326/82

(Continued)

FOREIGN PATENT DOCUMENTS

TW    202013850 A    4/2020

OTHER PUBLICATIONS

OA letter of a counterpart TW application (appl. No. 112100442) mailed on Oct. 27, 2023.Summary of the TW OA letter: 1. Paragraph [0081] of specification has an editorial error.2. Claim 1 is rejected as allegedly being unpatentable in view of cited reference 1 (TW 202013850 A, also published as U.S. Appl. No. 10/680,514B2) and cited reference 2 (US 2011/0133719 A1).3. Claims 2-9 are allowable.Correspondence bewteen claims of TW counterpart application and claims of US. Application: 1. Claims 1, 2-3, . . . , and 10 in TW counterpart application correspond to claims 1, 2-3, . . . and 10 in US.

*Primary Examiner* — Thomas J. Hiltunen
(74) *Attorney, Agent, or Firm* — WPAT, PC (57) ABSTRACT

The present disclosure discloses an input circuit having adaptive voltage-receiving mechanism. A voltage transmission circuit includes an internal N-type transistor and a first N-type transistor. The internal N-type transistor is coupled between an output node for generating an output voltage and a first node. The first N-type transistor is coupled between a first node and a second node and is controlled by a control voltage. The first N-type transistor generates a first node voltage at the first node. The second node is coupled to an input node for receiving an input voltage. A control voltage generation circuit includes a voltage dividing circuit and a first generation circuit. The voltage dividing circuit receives and compares the input voltage to generate a divided voltage. The first generation circuit receives the divided voltage and a supply voltage to generate the control voltage equaling the supply voltage according to the supply voltage being larger than the divided voltage.

8 Claims, 3 Drawing Sheets

(56) References Cited

U.S. PATENT DOCUMENTS

| | | |
|---|---|---|
| 10,680,514 B2 | 6/2020 | Watanabe |
| 11,031,776 B2 * | 6/2021 | Delshadpour ............ H02H 9/04 |
| 11,418,189 B2 * | 8/2022 | Singrigowda .... H03K 19/00315 |
| 2011/0133719 A1 | 6/2011 | Loke |
| 2024/0171176 A1 * | 5/2024 | Koudate .......... H03K 19/00315 |

* cited by examiner

INPUT CIRCUIT HAVING ADAPTIVE VOLTAGE-RECEIVING MECHANISM

BACKGROUND OF THE INVENTION

1. Field of the Invention

The present disclosure relates to an input circuit having adaptive voltage-receiving mechanism.

2. Description of Related Art

Along with the development of manufacturing process, some advanced processes do not include high voltage devices that is able to withstand higher voltages (e.g., 2.5 volts or 3.3 volts) and only allow devices that is able to withstand lower voltages (e.g., 1.8 volts) to be included.

However, interfaces that transmit signals of higher voltages such as 2.5, 3.3 or 5 volts are still used in some circuit systems. Under such a condition, if the circuits that receive the voltage signals do not have a corresponding circuit design for voltage input, the higher voltage inputs may cause the device reliability issue.

SUMMARY OF THE INVENTION

In consideration of the problem of the prior art, an object of the present disclosure is to provide an input circuit having adaptive voltage-receiving mechanism.

The present invention discloses an input circuit having adaptive voltage-receiving mechanism that includes a voltage transmission circuit and a control voltage generation circuit. The voltage transmission circuit includes an internal N-type transistor and a first N-type transistor. The internal N-type transistor is electrically coupled between an output node and a first node and is configured to be controlled by s supply voltage, wherein the output node generates an output voltage to an internal circuit. The first N-type transistor is electrically coupled between the first node and a second node and is configured to be controlled by a first control voltage, wherein the first N-type transistor generates a first node voltage at the first node, the second node is electrically coupled through a circuit path to an input node that receives an input voltage and the second node receives a second node voltage through the circuit path. The control voltage generation circuit includes a voltage dividing circuit and a first generation circuit. The voltage dividing circuit is configured to receive and divide the input voltage to generate a first divided voltage. The first generation circuit is configured to receive and compare the first divided voltage and the supply voltage to generate the first control voltage that equals the supply voltage according to the supply voltage being larger than the first divided voltage.

These and other objectives of the present disclosure will no doubt become obvious to those of ordinary skill in the art after reading the following detailed description of the preferred embodiments that are illustrated in the various figures and drawings.

DETAILED DESCRIPTION OF THE PREFERRED EMBODIMENTS

An aspect of the present invention is to provide an input circuit having adaptive voltage-receiving mechanism to provide adaptive processing on the input voltage according to different voltage input conditions to generate the output voltage that is in the same power domain of the input circuit and keep the components (or devices) in the input circuit from being damaged by the higher input voltages.

Figure 1:
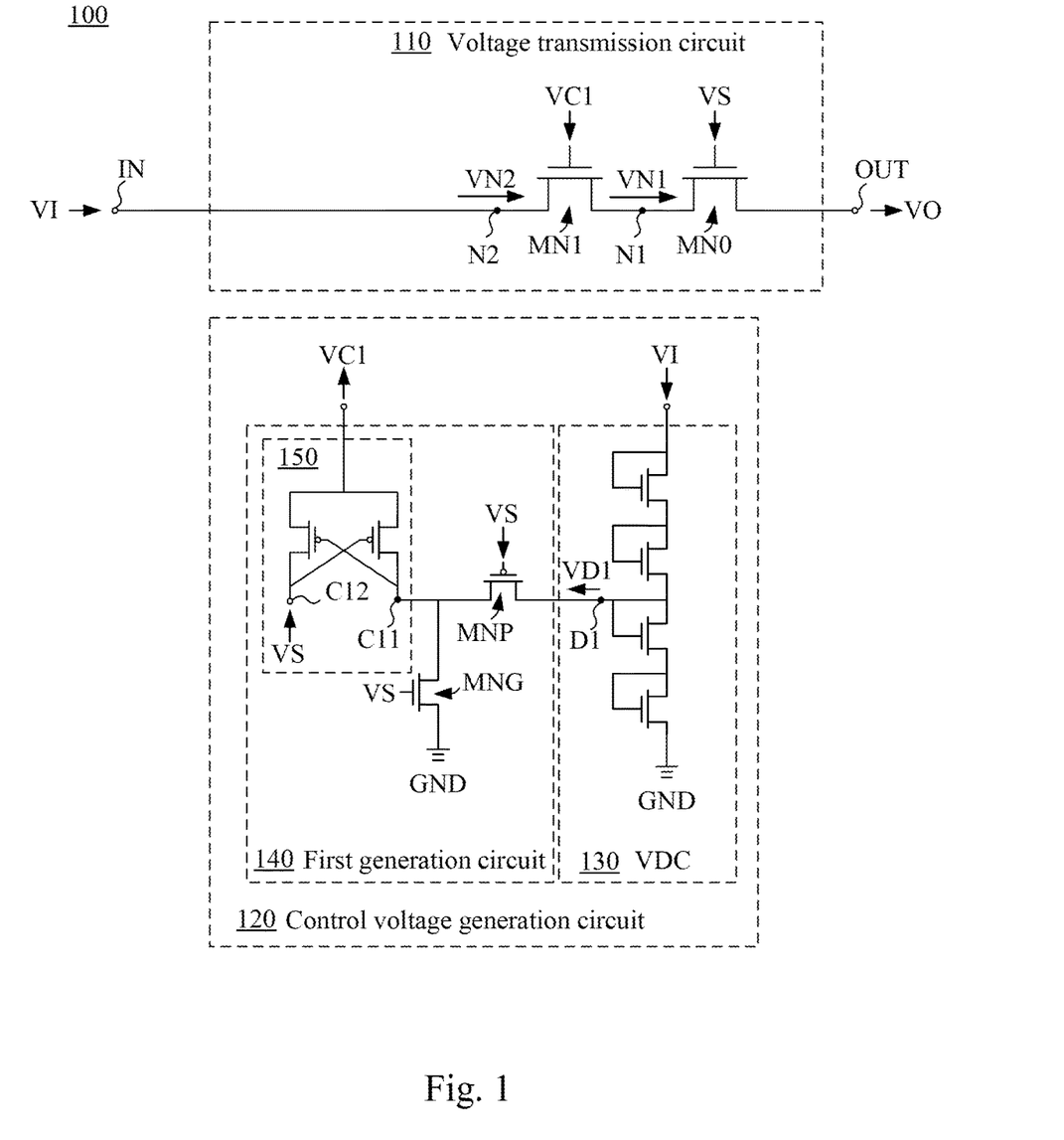
FIG. 1 illustrates a circuit diagram of an input circuit having adaptive voltage-receiving mechanism according to an embodiment of the present invention.

Reference is now made to FIG. 1. FIG. 1 illustrates a circuit diagram of an input circuit 100 having adaptive voltage-receiving mechanism according to an embodiment of the present invention.

The input circuit 100 is configured to receive an input voltage VI from an input node IN and generate an output voltage VO at an output node OUT. In an embodiment, the input circuit 100 is disposed in a circuit system (not illustrated). The input node IN is electrically coupled to such as, but not limited to an input/output pin of such a circuit system. The output node OUT is electrically coupled to an internal circuit of such a circuit system.

The input circuit 100 and the internal circuit are in the same power domain so as to be operated according to the same supply voltage VS, e.g., having a voltage value of 1.8 volts. The highest voltage that the components included in the input circuit 100 are able to withstand is the supply voltage VS (such as but not limited to 1.8 volts). The components included in the input circuit 100 can not withstand the voltages higher than the supply voltage VS.

However, the input voltage VI may be generated by an external circuit in a different power domain. When the input voltage VI is higher than the supply voltage VS, the input circuit 100 provides an adaptive voltage-receiving mechanism such that the input circuit 100 processes the input voltage VI to generate the output voltage VO in the same power domain of the input circuit 100 and keeps the components in the input circuit 100 from being damaged by the input voltage VI having higher voltage value.

Further, when the input voltage VI becomes zero volt or the supply voltage VS that the input circuit 100 receives becomes zero volt, the input circuit 100 may also avoid the over voltage damage under various kinds of voltage input conditions by using the adaptive voltage-receiving mechanism.

The input circuit 100 includes a voltage transmission circuit 110 and a control voltage generation circuit 120.

The voltage transmission circuit 110 includes an internal N-type transistor MN0 and a first N-type transistor MN1.

The internal N-type transistor MN0 is electrically coupled between the output node OUT and a first node N1 and is configured to be controlled by the supply voltage VS. The first N-type transistor MN1 is electrically coupled between the first node N1 and the second node N2 and is configured to be controlled by a first control voltage VC1. The first N-type transistor MN1 generates a first node voltage VN1 at the first node N1. The second node N2 is electrically coupled to the input node IN through a circuit path disposed between the second node N2 and the input node IN, wherein the input node IN receives the input voltage VI. The second node N2 receives a second node voltage VN2 from the circuit path. In the present embodiment, the circuit path between the second node N2 and the input node IN does not include any circuit component. As a result, the second node voltage VN2 is the input voltage VI.

The control voltage generation circuit 120 includes a voltage dividing circuit 130 (abbreviated as VDC in FIG. 1) and a first generation circuit 140.

The voltage dividing circuit 130 is configured to receive and divide the input voltage VI to generate the first divided voltage VD1. In different embodiments, the voltage dividing circuit 130 can be implemented by diode-connected N-type transistors, diode-connected P-type transistors, polysilicon resistors, diffusion resistors, well resistors or a combination thereof coupled in series.

The first generation circuit 140 is configured to receive and compare the first divided voltage VD1 and the supply voltage VS to generate the first control voltage VC1 that equals the supply voltage VS according to the supply voltage VS being larger than the first divided voltage VD1. Any cross-voltage between any two terminals of the first N-type transistor MN1 is not larger than the highest withstanding voltage thereof (such as but not limited to 1.8 volts). On the other hand, the first generation circuit 140 is further configured to generate the first control voltage VC1 that equals the first divided voltage VD1 according to the supply voltage VS that is zero.

The first generation circuit 140 includes a voltage generation N-type transistor MNG, a voltage generation P-type transistor MNP and a comparison circuit 150.

The voltage generation N-type transistor MNG is electrically coupled between a first comparison terminal C11 and a ground terminal GND and is configured to be controlled by the supply voltage VS. The voltage generation P-type transistor MNP is electrically coupled between a first voltage-division terminal D1 of the voltage dividing circuit 130 and the first comparison terminal C11 and is configured to be controlled by the supply voltage VS, so as to receive the first divided voltage VD1 from the first voltage-division terminal D1.

The comparison circuit 150 is electrically coupled to the first comparison terminal C11 and a second comparison terminal C12 that receives the supply voltage VS, to output a higher voltage of one of the first comparison terminal C11 and the second comparison terminal C12 as the first control voltage VC1. In an embodiment, the comparison circuit 150 can be implemented by such as but not limited to a pair of cross-coupled P-type transistors. However, the present invention is not limited thereto.

According to different values of the input voltage VI, the supply voltage VS and the first divided voltage VD1, the first generation circuit 140 generates different values of the first control voltage VC1 such that the voltage transmission circuit 110 receives the input voltage VI accordingly and generates the output voltage VO. The operation of the input circuit 100 under different value combinations of the input voltage VI and the supply voltage VS is described in detail in the following paragraphs.

In an embodiment, the input voltage VI is 2.5 volts and the supply voltage VS is 1.8 volts. The first divided voltage VD1 generated by the voltage dividing circuit 130 is approximately a half of the input voltage VI, which is 1.2 volts. The threshold voltage of each of the transistors is 0.5 volts.

The voltage generation P-type transistor MNP is turned on and the voltage generation N-type transistor MNG is turned off according to the supply voltage VS being larger than the first divided voltage VD1. As a result, the voltage generation P-type transistor MNP does not transmit the first divided voltage VD1. The voltage generation N-type transistor MNG pulls low the voltage of the first comparison terminal C11 and generates a zero voltage at the first comparison terminal C11. The comparison circuit 150 outputs a higher voltage of one of the first comparison terminal C11 and the second comparison terminal C12, which is the supply voltage VS, as the first control voltage VC1.

Under such a condition, the first N-type transistor MN1 receives the input voltage VI of 2.5 volts from the second node N2 and is controlled by the first control voltage VC1 of 1.8 volts. The first node voltage VN1 of 1.3 volts is generated at the first node N1. The first N-type transistor MN1 at most generates a voltage at the first node N1 that subtracts the threshold voltage thereof of 0.5 volts from the gate voltage thereof of 1.8 volts. As a result, the first node voltage VN1 of 1.3 volts is generated at the first node N1.

The internal N-type transistor MN0 receives the first node voltage VN1 of 1.3 volts from the first node, is controlled by the supply voltage VS of 1.8 volts and generates the output voltage VO of 1.3 volts at the output node OUT. The internal N-type transistor MN0 at most generates a voltage at the output node OUT that subtracts the threshold voltage thereof of 0.5 volts from the gate voltage thereof of 1.8 volts. As a result, the output voltage VO of 1.3 volts is generated at the output node OUT. As a result, the output voltage VO can be received by the internal circuit that is in the power domain same as that of the input circuit 100. In an embodiment, the internal circuit that the output node OUT is electrically coupled to may have a voltage adjusting mechanism to adjust the output voltage VO to 1.8 volts.

As a result, any cross-voltage of between any two terminals of each of the first N-type transistor MN1 and the internal N-type transistor MN0 is not larger than a highest withstanding (or sustainable) voltage thereof.

In an embodiment, the input voltage VI is 1.8 volts and the supply voltage VS is 1.8 volts. The first divided voltage VD1 generated by the voltage dividing circuit 130 is approximately a half of the input voltage VI, which is 0.9 volts.

The voltage generation P-type transistor MNP is turned off and the voltage generation N-type transistor MNG is turned on according to the supply voltage VS being larger than the first divided voltage VD1. A zero voltage is generated at the first comparison terminal C11 accordingly such that the comparison circuit 150 outputs the supply voltage VS as the first control voltage VC1.

Under such a condition, the first N-type transistor MN1 receives the input voltage VI of 1.8 volts from the second node N2, is controlled by the first control voltage VC1 of 1.8 volts and generates the first node voltage VN1 of 1.3 volts at the first node N1. The internal N-type transistor MN0 receives the first node voltage VN1 of 1.3 volts from the first node N1 and is controlled by the supply voltage VS of 1.8 volts. The output voltage VO of 1.3 volts is generated at the output node OUT. As a result, any cross-voltage between any two terminals of each of the first N-type transistor MN1 and the internal N-type transistor MN0 is not larger than a highest withstanding voltage thereof.

In an embodiment, the input voltage VI is 0 volt and the supply voltage VS is 1.8 volts. The first divided voltage VD1 generated by the voltage dividing circuit 130 is 0 volt.

The voltage generation P-type transistor MNP is turned off and the voltage generation N-type transistor MNG is turned on according to the supply voltage VS being larger than the first divided voltage VD1. The zero voltage is generated at the first comparison terminal C11 such that the comparison circuit 150 outputs the supply voltage VS as the first control voltage VC1.

Since the input voltage VI is 0 volt, the first N-type transistor MN1 and the internal N-type transistor MN0 are both turned on to transmit the input voltage VI of 0 volt. Each of the voltage of the second node N2, the first node N1 and the output node OUT is 0. As a result, any cross-voltage between any two terminals of each of the first N-type transistor MN1 and the internal N-type transistor MN0 is not larger than a highest withstanding voltage thereof.

In an embodiment, the input voltage VI is 2.5 volts, the supply voltage VS is 0 volt. The first divided voltage VD1 generated by the voltage dividing circuit 130 is 1.2 volts.

The voltage generation P-type transistor MNP is turned on and the voltage generation N-type transistor MNG is turned off according to the supply voltage VS being smaller than the first divided voltage VD1. The first divided voltage VD1 of 1.2 volts is outputted at the first comparison terminal C11 such that the comparison circuit 150 outputs the first divided voltage V D1 as the first control voltage VC1.

Under such a condition, the first N-type transistor MN1 receives the input voltage VI of 2.5 volts from the second node N2 and is controlled by the first control voltage VC1 of 1.2 volts. The first node voltage VN1 of 0.7 volts is generated at the first node N1. The internal N-type transistor MN0 receives the first node voltage VN1 of 0.7 volts from first node and is controlled by the supply voltage VS of 0 volt so as to be turned off. The output voltage VO of 0 volt is generated at the output node OUT. As a result, any cross-voltage between any two terminals of each of the first N-type transistor MN1 and the internal N-type transistor MN0 is not larger than a highest withstanding voltage thereof.

Figure 2:
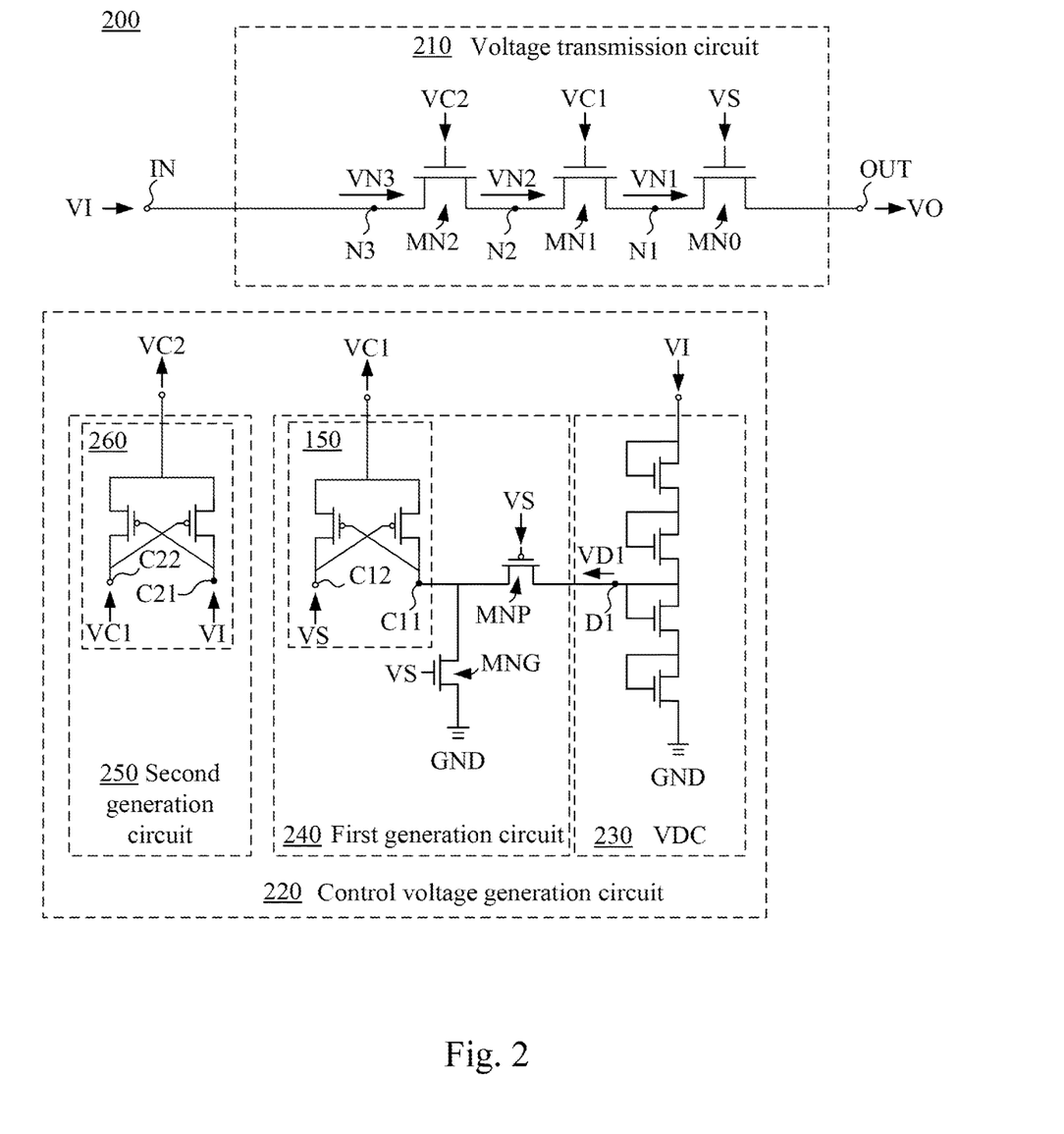
FIG. 2 illustrates a circuit diagram of an input circuit having adaptive voltage-receiving mechanism according to another embodiment of the present invention.

Reference is now made to FIG. 2. FIG. 2 illustrates a circuit diagram of an input circuit 200 having adaptive voltage-receiving mechanism according to another embodiment of the present invention. Similar to the input circuit 100 in FIG. 1, the input circuit 200 includes a voltage transmission circuit 210 and a control voltage generation circuit 220.

The voltage transmission circuit 210 includes the internal N-type transistor MN0, the first N-type transistor MN1 and the second N-type transistor MN2. The configuration and operation of the internal N-type transistor MN0 and the first N-type transistor MN1 are the same as those illustrated in FIG. 1. The detail is not described herein.

The second N-type transistor MN2 is disposed at the circuit path between the second node N2 and the input node IN, is electrically coupled between the second node N2 and a third node N3 and is configured to be controlled by a second control voltage VC2. The second N-type transistor MN2 generates the second node voltage VN2 at the second node N2. The third node N3 is electrically coupled to the input node IN. A third node voltage VN3 at the third node N3 is the input voltage VI.

The control voltage generation circuit 220 includes a voltage dividing circuit 230 (abbreviated as VDC in FIG. 2), a first generation circuit 240 and a second generation circuit 250. The configuration and operation of the voltage dividing circuit 230 and the first generation circuit 240 are the same as those illustrated in FIG. 1. The detail is not described herein.

The second generation circuit 250 is configured to receive and compare the input voltage VI and the first control voltage VC1 to generate the second control voltage VC2 that equals the input voltage VI according to the input voltage VI being larger than or equaling the first control voltage VC1 such that any cross-voltage between any two terminals of the second N-type transistor MN2 is not larger than a highest withstanding voltage thereof. On the other hand, the second generation circuit 250 is further configured to generate the second control voltage VC2 that equals the input voltage VI according to the supply voltage VS that is zero.

In an embodiment, the second generation circuit 250 includes a comparison circuit 260. The comparison circuit 260 is electrically coupled to a first comparison terminal C21 that receives the input voltage VI and a second comparison terminal C22 that receives the first control voltage VC1. The comparison circuit 260 is configured to output a higher voltage of one of the first comparison terminal C21 and the second comparison terminal C22 as the second control voltage V C2.

According to different values of the input voltage VI, the supply voltage VS and the first divided voltage VD1, the first generation circuit 240 and the second generation circuit 250 generate different values of the first control voltage VC1 and the second control voltage V C2 such that the voltage transmission circuit 210 receives the input voltage VI accordingly and generates the output voltage VO. The operation of the input circuit 200 under different value combinations of the input voltage VI and the supply voltage VS is described in detail in the following paragraphs.

In an embodiment, the input voltage VI is 3.3 volts and the supply voltage VS is 1.8 volts. The first divided voltage VD1 generated by the voltage dividing circuit 230 is approximately a half of the input voltage VI, which is 1.6 volts.

In the first generation circuit 240, the voltage generation P-type transistor MNP is turned off and the voltage generation N-type transistor MNG is turned on according to the supply voltage VS being larger than the first divided voltage VD1. A zero voltage is generated at the first comparison terminal C11 accordingly such that the comparison circuit 150 outputs the supply voltage VS as the first control voltage VC1.

In the second generation circuit 250, the comparison circuit 260 receives and compares the input voltage VI and the first control voltage VC1 to output the input voltage VI that is relatively higher as the second control voltage VC2.

Under such a condition, the second N-type transistor MN2 receives the input voltage VI of 3.3 volts from the third node N3 and is controlled by the second control voltage VC2 of 3.3 volts. The second node voltage VN2 of 2.8 volts is generated at the second node N2. The first N-type transistor MN1 receives the input voltage VI of 2.8 volts from the second node N2 and is controlled by the first control voltage VC1 of 1.8 volts. The first node voltage VN1 of 1.3 volts is generated at the first node N1. The internal N-type transistor MN0 receives the first node voltage VN1 of 1.3 volts from the first node N1 and is controlled by the supply voltage VS of 1.8 volts. The output voltage VO of 1.3 volts is generated at the output node OUT.

As a result, any cross-voltage between any two terminals of each of the second N-type transistor MN2, the first N-type transistor MN1 and the internal N-type transistor MN0 is not larger than a highest withstanding voltage thereof.

In an embodiment, the input voltage VI is 1.8 volts and the supply voltage VS is 1.8 volts. The first divided voltage VD1 generated by the voltage dividing circuit 230 is approximately a half of the input voltage VI, which is 0.9 volts.

In the first generation circuit 240, the voltage generation P-type transistor MNP is turned off and the voltage generation N-type transistor MNG is turned on according to the supply voltage VS being larger than the first divided voltage VD1. A zero voltage is generated at the first comparison terminal C11 accordingly such that the comparison circuit 150 outputs the supply voltage VS as the first control voltage VC1.

In the second generation circuit 250, the comparison circuit 260 receives the input voltage VI and the first control voltage VC1 having the same voltage value. The comparison circuit 260 may select any one of them, e.g., the input voltage VI, to be outputted as the second control voltage VC2.

Under such a condition, the second N-type transistor MN2 receives the input voltage VI of 1.8 volts from the third node N3 and is controlled by the second control voltage VC2 of 1.8 volts. The second node voltage VN2 of 1.3 volts is generated at the second node N2. The first N-type transistor MN1 receives the input voltage VI of 1.3 volts from the second node N2 and is controlled by the first control voltage VC1 of 1.8 volts. The first node voltage VN1 of 1.3 volts is generated at the first node N1. The internal N-type transistor MN0 receives the first node voltage VN1 of 1.3 volts from first node and is controlled by the supply voltage VS of 1.8 volts. The output voltage VO of 1.3 volts is generated at the output node OUT.

As a result, any cross-voltage between any two terminals of each of the second N-type transistor MN2, the first N-type transistor MN1 and the internal N-type transistor MN0 is not larger than a highest withstanding voltage thereof.

In an embodiment, the input voltage VI is 0 volt and the supply voltage VS is 1.8 volts. The first divided voltage VD1 generated by the voltage dividing circuit 230 is 0 volt.

In the first generation circuit 240, the voltage generation P-type transistor MNP is turned off and the voltage generation N-type transistor MNG is turned on according to the supply voltage VS being larger than the first divided voltage VD1. A zero voltage is generated at the first comparison terminal C11 such that the comparison circuit 150 outputs the supply voltage VS as the first control voltage VC1.

In the second generation circuit 250, the comparison circuit 260 receives and compares the input voltage VI and the first control voltage VC1 to output the first control voltage VC1 that is relatively higher as the second control voltage VC2.

Since the input voltage VI is 0 volt, the second N-type transistor MN2, the first N-type transistor MN1 and the internal N-type transistor MN0 are turned on to transmit the input voltage VI of 0 volt. The voltage value of each of the third node N3, the second node N2, the first node N1 and the output node OUT is 0. Any cross-voltage between any two terminals of each of the first N-type transistor MN1 and the internal N-type transistor MN0 is not larger than a highest withstanding voltage thereof.

In an embodiment, the input voltage VI is 3.3 volts and the supply voltage VS is 0 volt. The first divided voltage VD1 generated by the voltage dividing circuit 230 is 1.6 volts.

In the first generation circuit 240, the voltage generation P-type transistor MNP is turned on and the voltage generation N-type transistor MNG is turned off according to the supply voltage VS being smaller than the first divided voltage VD1. The first divided voltage VD1 of 1.6 volts is generated at the first comparison terminal C11 such that the comparison circuit 150 outputs the first divided voltage VD1 as the first control voltage VC1.

In the second generation circuit 250, the comparison circuit 260 receives and compares the input voltage VI and the first control voltage VC1 to output the input voltage VI that is relatively higher as the second control voltage VC2.

Under such a condition, the second N-type transistor MN2 receives the input voltage VI of 3.3 volts from the third node N3 and is controlled by the second control voltage VC2 of 3.3 volts. The second node voltage VN2 of 2.8 volts is generated at the second node N2. The first N-type transistor MN1 receives the second node voltage VN2 of 2.8 volts from the second node N2 and is controlled by the first control voltage VC1 of 1.6 volts. The first node voltage VN1 of 1.1 volts is generated at the first node N1. The internal N-type transistor MN0 receives the first node voltage VN1 of 1.1 volts from first node and is controlled by the supply voltage VS of 0 volt so as to be turned on. The output voltage VO of 0 volt is generated at the output node OUT.

As a result, any cross-voltage between any two terminals of each of the second N-type transistor MN2, the first N-type transistor MN1 and the internal N-type transistor MN0 is not larger than a highest withstanding voltage thereof.

Figure 3:
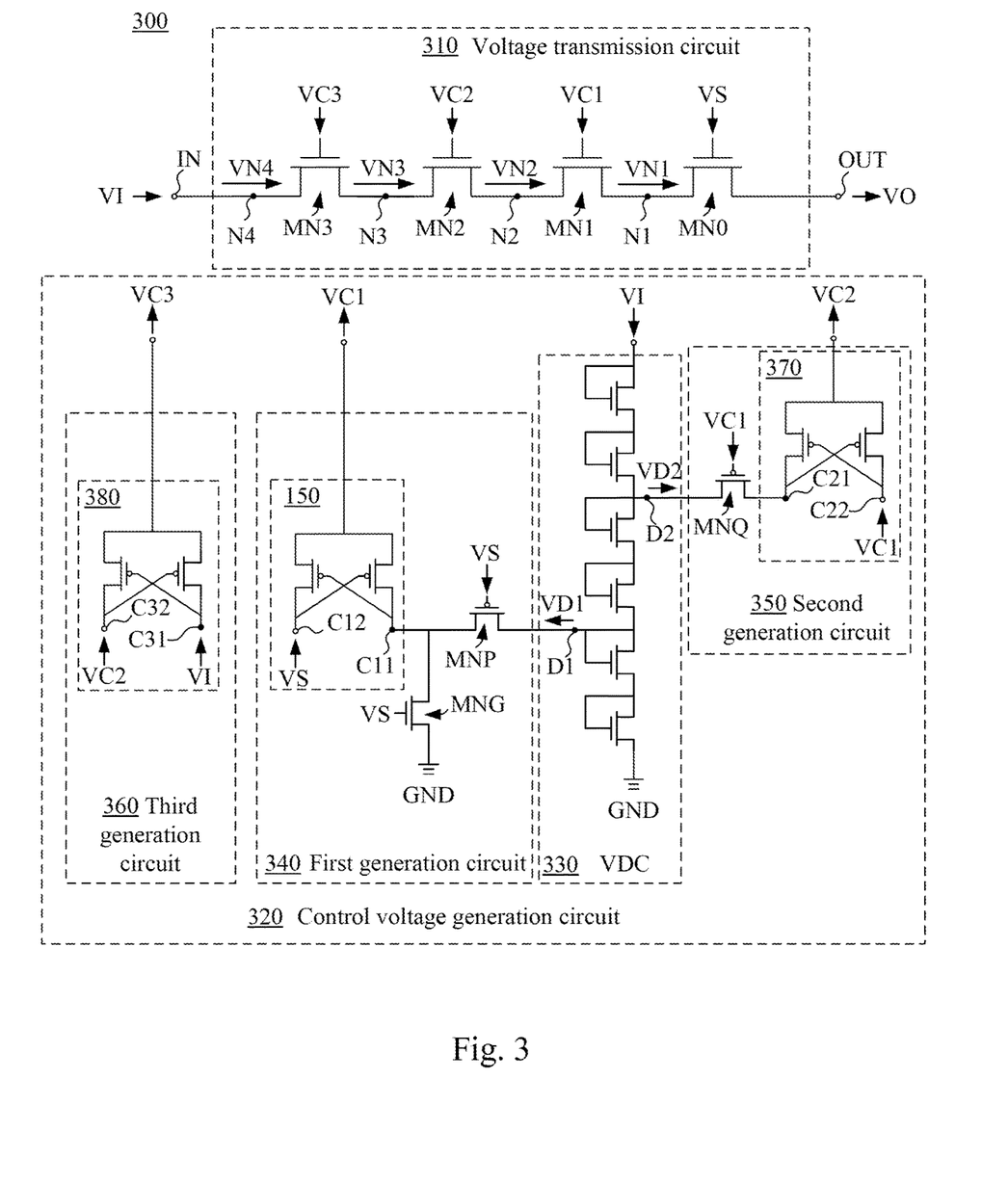
FIG. 3 illustrates a circuit diagram of an input circuit having adaptive voltage-receiving mechanism according to yet another embodiment of the present invention.

Reference is now made to FIG. 3. FIG. 3 illustrates a circuit diagram of an input circuit 300 having adaptive voltage-receiving mechanism according to yet another embodiment of the present invention. Similar to the input circuit 200 in FIG. 2, input circuit 300 includes a voltage transmission circuit 310 and a control voltage generation circuit 320.

The voltage transmission circuit 310 includes the internal N-type transistor MN0, the first N-type transistor MN1, the second N-type transistor MN2 and the third N-type transistor MN3. The configuration and operation of the internal N-type transistor MN0, the first N-type transistor MN1 and the second N-type transistor MN2 are the same as those illustrated in FIG. 2. The detail is not described herein.

The third N-type transistor MN3 is disposed at the circuit path between the second node N2 and the input node IN and is electrically coupled between the third node N3 and the fourth node N4. The third N-type transistor MN3 is configured to be controlled by a third control voltage VC3. The third N-type transistor MN3 generates the third node voltage VN3 at the third node N3. The fourth node N4 is electrically coupled to the input node IN. The fourth node voltage VN4 at the fourth node N4 is the input voltage VI.

The control voltage generation circuit 320 includes a voltage dividing circuit 330 (abbreviated as VDC in FIG. 3), a first generation circuit 340, a second generation circuit 350 and a third generation circuit 360.

The voltage dividing circuit 330 is configured to receive and divide the input voltage VI to generate the first divided voltage VD1 and a second divided voltage VD2.

The configuration and operation of the first generation circuit 340 are the same as those illustrated in FIG. 2. The detail is not described herein.

The second generation circuit 350 is configured to receive and compare the second divided voltage VD2 and the first control voltage VC1, in which the second divided voltage VD2 is generated by dividing the input voltage VI by the voltage dividing circuit 330, to generate the second control voltage VC2 that equals the second divided voltage VD2 according to the second divided voltage VD2 being larger than the first control voltage VC1. Any cross-voltage between any two terminals of the second N-type transistor MN2 is not larger than a highest withstanding voltage thereof. On the other hand, the second generation circuit 350 is further configured to generate the second control voltage VC2 that equals the first control voltage VC1 according to the input voltage VI that is zero.

The second generation circuit 350 includes a voltage generation P-type transistor MNQ and a comparison circuit 370.

The voltage generation P-type transistor MNQ is electrically coupled between a second voltage-division terminal D2 of the voltage dividing circuit 330 and the first comparison terminal C21 and is configured to be controlled by a first control voltage VS. The voltage generation P-type transistor MNQ receives the second divided voltage VD2 from the second voltage-division terminal D2.

The comparison circuit 370 is electrically coupled to the first comparison terminal C21 and the second comparison terminal C22 that receives the first control voltage VC1 and is configured to output a higher voltage of one of the first comparison terminal C21 and the second comparison terminal C22 as the second control voltage VC2.

The third generation circuit 360 is configured to receive and compare the input voltage VI and the second control voltage VC2 to generate the third control voltage VC3 that equals the input voltage VI according to the input voltage VI being larger than or equaling the second control voltage VC2. Any cross-voltage between any two terminals of the third N-type transistor MN3 is not larger than a highest withstanding voltage thereof. On the other hand, the third generation circuit 360 is further configured to generate the third control voltage VC3 that equals the second control voltage VC2 according to the input voltage VI that is zero.

The third generation circuit 360 includes a comparison circuit 380. The comparison circuit 380 is electrically coupled to a first comparison terminal C31 that receives the input voltage VI and a second comparison terminal C32 that receives the second control voltage VC2 and is configured to output a higher voltage of one of the first comparison terminal C31 and the second comparison terminal C32 as the third control voltage VC3.

According to different values of the input voltage VI, the supply voltage VS, the first divided voltage VD1 and the second divided voltage VD2, the first generation circuit 340, the second generation circuit 350 and the third generation circuit 360 generate different values of the first control voltage VC1, the second control voltage VC2 and the third control voltage VC3 such that the voltage transmission circuit 310 receives the input voltage VI accordingly and generates the output voltage VO. The operation of the input circuit 300 under different value combinations of the input voltage VI and the supply voltage VS is described in detail in the following paragraphs.

In an embodiment, the input voltage VI is 5 volts and the supply voltage VS is 1.8 volts. The first divided voltage VD1 generated by the voltage dividing circuit 330 is approximately one-third of the input voltage VI, which is 1.8 volts. The second divided voltage VD2 generated accordingly is approximately two-third of the input voltage VI, which is 3.3 volts.

In the first generation circuit 340, the voltage generation P-type transistor MNP is turned off and the voltage generation N-type transistor MNG is turned on according to the supply voltage VS being larger than the first divided voltage VD1. A zero voltage is generated at the first comparison terminal C11 accordingly such that the comparison circuit 150 outputs the supply voltage VS as the first control voltage VC1.

In the second generation circuit 350, the voltage generation P-type transistor MNQ is turned on according to the second divided voltage VD2 being larger than the first control voltage VS to transmit the second divided voltage VD2 to the first comparison terminal C21 such that the comparison circuit 350 outputs the second divided voltage VD2 as the second control voltage VC2.

In the third generation circuit 360, the comparison circuit 380 receives and compares the input voltage VI and the second control voltage VC2 to output the input voltage VI that is relatively higher as the third control voltage VC3.

Under such a condition, the third N-type transistor MN3 receives the input voltage VI of 5 volts from the fourth node N4 and is controlled by the third control voltage VC3 of 5 volts. The third node voltage VN3 of 4.5 volts is generated at the third node N3. The second N-type transistor MN2 receives the third node voltage VN3 of 4.5 volts from the third node N3 and is controlled by the second control voltage VC2 of 3.3 volts. The second node voltage VN2 of 2.8 volts is generated at the second node N2. The first N-type transistor MN1 receives the second node voltage VN2 of 2.8 volts from the second node N2 and is controlled by the first control voltage VC1 of 1.8 volts. The first node voltage VN1 of 1.3 volts is generated at the first node N1. The internal N-type transistor MN0 receives the first node voltage VN1 of 1.3 volts from first node and is controlled by the supply voltage VS of 1.8 volts. The output voltage VO of 1.3 volts is generated at the output node OUT.

As a result, any cross-voltage between any two terminals of each of the third N-type transistor MN3, the second N-type transistor MN2, the first N-type transistor MN1 and the internal N-type transistor MN0 is not larger than a highest withstanding voltage thereof.

In an embodiment, the input voltage VI can be 3.3 volts, 1.8 volts or 0 volt. The supply voltage VS is 1.8 volts or 0 volt. The input circuit 300 may operate according to the mechanisms described in the above embodiments. The operation of each of the circuit components is not described herein. In the following paragraphs, only the voltage values generated during the operation are described.

When the input voltage VI is 3.3 volts and the supply voltage VS is 1.8 volts, the first divided voltage VD1 and the second divided voltage VD2 are 1.2 volts and 2.5 volts respectively. The third, the second and the first control voltages VC3~VC1 are 3.3, 2.5 and 1.8 volts respectively. The third, the second and the first node voltages VN3~VN1 are 2.8, 2, 1.3 volts respectively. The output voltage VO is 1.3 volts.

When the input voltage VI is 1.8 volts and the supply voltage VS is 1.8 volts, the first divided voltage VD1 and the second divided voltage VD2 are 0.6 volts and 1.2 volts. Each of the third, the second and the first control voltages VC3~VC1 is 1.8 volts. Each of the third, the second and the first node voltages VN3~VN1 is 1.3 volts. The output voltage VO is 1.3 volts.

When the input voltage VI is 0 volt and the supply voltage VS is 1.8 volts, each of the first divided voltage VD1 and the second divided voltage VD2 is 0 volt. Each of the third, the second and the first control voltages VC3~VC1 is 1.8 volts. Each of the third, the second and the first node voltages VN3~VN1 is 0 volt. The output voltage VO is 0 volt.

When the input voltage VI is 5 volts and the supply voltage VS is 0 volt, the first divided voltage VD1 and the second divided voltage VD2 are 1.8 volts and 3.3 volts respectively. The third, the second and the first control voltages VC3~VC1 are 5, 3.3, 1.8 volts respectively. The third, the second and the first node voltages VN3~VN1 are 4.5, 2.8, 1.3 volts respectively. The output voltage VO is 0 volt.

When the input voltage VI is 3.3 volts and the supply voltage VS is 0 volt, the first divided voltage VD1 and the second divided voltage VD2 are 1.2 volts and 2.5 volts respectively. The third, the second and the first control voltages VC3~VC1 are 3.3, 2.5, 1.2 volts respectively. The third, the second and the first node voltages VN3~VN1 are 2.8, 2, 0.7 volts respectively. The output voltage VO is 0 volt.

In the conditions described above, any cross-voltage between any two terminals of each of the third N-type transistor MN3, the second N-type transistor MN2, the first N-type transistor MN1 and the internal N-type transistor MN0 is not larger than a highest withstanding voltage thereof.

It is appreciated that in each of the figures of the above embodiments, the voltage transmission circuit and the control voltage generation circuit are illustrated separately in order to keep the figures clear. However, the corresponding nodes having the same voltage are electrically coupled together. For example, the comparison circuit 150 in FIG. 1 is actually electrically coupled to the first N-type transistor MN1 to feed the first control voltage VC1 to the first N-type transistor MN1. Other corresponding nodes having the same voltage have identical electrically coupling relation described above. The detail is not described herein.

It is appreciated that the embodiments described above are merely an example. In other embodiments, it is appreciated that many modifications and changes may be made by those of ordinary skill in the art without departing, from the spirit of the invention. For example, the control voltage generation circuit may include different amounts and configurations of the voltage dividing circuit and the generate circuit depending on the voltages applied thereto. The voltage values of each of the nodes in the above embodiments may also be different depending on practical requirements and the manufacturing process differences of each of the circuit components. The present invention is not limited thereto.

In summary, the input circuit having adaptive voltage-receiving mechanism provides adaptive processing on the input voltage according to different voltage input conditions to generate the output voltage that is in the same power domain of the input circuit and keep the components in the input circuit from being damaged by the higher input voltages.

The aforementioned descriptions represent merely the preferred embodiments of the present disclosure, without any intention to limit the scope of the present disclosure thereto. Various equivalent changes, alterations, or modifications based on the claims of present disclosure are all consequently viewed as being embraced by the scope of the present disclosure.

What is claimed is:

1. An input circuit having adaptive voltage-receiving mechanism comprising:
  a voltage transmission circuit comprising:
    an internal N-type transistor electrically coupled between an output node and a first node and configured to be controlled by a supply voltage, wherein the output node generates an output voltage to an internal circuit; and
    a first N-type transistor electrically coupled between the first node and a second node and configured to be controlled by a first control voltage, wherein the first N-type transistor generates a first node voltage at the first node, the second node is electrically coupled through a circuit path to an input node that receives an input voltage, and the second node receives a second node voltage through the circuit path; and
  a control voltage generation circuit comprising:
    a voltage dividing circuit configured to receive and divide the input voltage to generate a first divided voltage; and
    a first generation circuit configured to receive and compare the first divided voltage and the supply voltage to generate the first control voltage that equals the supply voltage according to the supply voltage being larger than the first divided voltage and generate the first control voltage that equals the first divided voltage according to the supply voltage that equals 0, wherein the first generation circuit comprises:
      a voltage generation N-type transistor electrically coupled between a first comparison terminal and a ground terminal and configured to be controlled by the supply voltage;
      a voltage generation P-type transistor electrically coupled between a first voltage-division terminal of the voltage dividing circuit and the first comparison terminal and configured to be controlled by the supply voltage, so as to receive the first divided voltage from the first voltage-division terminal; and
      a comparison circuit electrically coupled to the first comparison terminal and a second comparison terminal that receives the supply voltage, to output a higher voltage of one of the first comparison terminal and the second comparison terminal as the first control voltage;
    wherein the voltage generation P-type transistor and the voltage generation N-type transistor generates a zero voltage at the first comparison terminal according to the supply voltage being larger than the first divided voltage, such that the comparison circuit outputs the supply voltage as the first control voltage;
    the voltage generation P-type transistor and the voltage generation N-type transistor outputs the first divided voltage at the first comparison terminal according to the supply voltage that equals 0, such that the comparison circuit outputs the first divided voltage as the first control voltage.

2. An input circuit having adaptive voltage-receiving mechanism comprising:
  a voltage transmission circuit comprising:
    an internal N-type transistor electrically coupled between an output node and a first node and configured to be controlled by a supply voltage, wherein the output node generates an output voltage to an internal circuit; and
    a first N-type transistor electrically coupled between the first node and a second node and configured to be controlled by a first control voltage, wherein the first N-type transistor generates a first node voltage at the first node, the second node is electrically coupled through a circuit path to an input node that receives an input voltage, and the second node receives a second node voltage through the circuit path; and
  a control voltage generation circuit comprising:
    a voltage dividing circuit configured to receive and divide the input voltage to generate a first divided voltage; and
    a first generation circuit configured to receive and compare the first divided voltage and the supply voltage to generate the first control voltage that equals the supply voltage according to the supply voltage being larger than the first divided voltage;

wherein the voltage transmission circuit further comprises a second N-type transistor disposed at the circuit path, the second N-type transistor being electrically coupled between the second node and a third node and being configured to be controlled by a second control voltage, wherein the second N-type transistor generates a second node voltage at the second node, the third node is electrically coupled to the input node, and a third node voltage at the third node is the input voltage;

the control voltage generation circuit further comprises a second generation circuit configured to receive and compare the input voltage and the first control voltage, so as to generate the second control voltage that equals the input voltage according to the input voltage being larger than or equaling the first control voltage.

3. The input circuit of claim 2, wherein the second generation circuit is further configured to generate the second control voltage that equals the input voltage according to the supply voltage that is zero.

4. The input circuit of claim 3, wherein the second generation circuit comprises:

a comparison circuit electrically coupled to a first comparison terminal that receives the input voltage and a second comparison terminal that receives the first control voltage and configured to output a higher voltage of one of the first comparison terminal and the second comparison terminal as the second control voltage.

5. An input circuit having adaptive voltage-receiving mechanism comprising:

a voltage transmission circuit comprising:

an internal N-type transistor electrically coupled between an output node and a first node and configured to be controlled by a supply voltage, wherein the output node generates an output voltage to an internal circuit; and a first N-type transistor electrically coupled between the first node and a second node and configured to be controlled by a first control voltage, wherein the first N-type transistor generates a first node voltage at the first node, the second node is electrically coupled through a circuit path to an input node that receives an input voltage, and the second node receives a second node voltage through the circuit path; and a control voltage generation circuit comprising:

a voltage dividing circuit configured to receive and divide the input voltage to generate a first divided voltage; and a first generation circuit configured to receive and compare the first divided voltage and the supply voltage to generate the first control voltage that equals the supply voltage according to the supply voltage being larger than the first divided voltage;

wherein the voltage transmission circuit further comprises:

a second N-type transistor and a third N-type transistor disposed at the circuit path, wherein:

the second N-type transistor is electrically coupled between the second node and a third node and is configured to be controlled by a second control voltage, wherein the second N-type transistor generates a second node voltage at the second node; and the third N-type transistor is electrically coupled between the third node and a fourth node and is configured to be controlled by a third control voltage, wherein the third N-type transistor generates a third node voltage at the third node, the fourth node is electrically coupled to the input node, and a fourth node voltage at the fourth node is the input voltage; and the control voltage generation circuit further comprises a second generation circuit and a third generation circuit, wherein:

the second generation circuit is configured to receive and compare a second divided voltage and the first control voltage, wherein the second divided voltage is generated by dividing the input voltage by the voltage dividing circuit, to generate the second control voltage that equals the second divided voltage according to the second divided voltage being larger than the first control voltage; and the third generation circuit is configured to receive and compare the input voltage and the second control voltage, to generate the third control voltage that equals the input voltage according to the input voltage being larger than or equaling the second control voltage.

6. The input circuit of claim 5, wherein the second generation circuit is further configured to generate the second control voltage that equals the first control voltage according to the input voltage that is zero, and the third generation circuit is further configured to generate the third control voltage that equals the second control voltage according to the input voltage that is zero.

7. The input circuit of claim 6, wherein the second generation circuit comprises:

a voltage generation P-type transistor electrically coupled between a second voltage-division terminal of the voltage dividing circuit and a first comparison terminal and configured to be controlled by the first control voltage so as to receive the second divided voltage from the second voltage-division terminal; and a comparison circuit electrically coupled to the first comparison terminal and a second comparison terminal that receives the first control voltage, and configured to output a higher voltage of one of the first comparison terminal and the second comparison terminal as the second control voltage.

8. The input circuit of claim 6, wherein the third generation circuit comprises:

a comparison circuit electrically coupled to a first comparison terminal that receives the input voltage and a second comparison terminal that receives the second control voltage, and configured to output a higher voltage of one of the first comparison terminal and the second comparison terminal as the third control voltage.

* * * * *